US006541346B2

(12) United States Patent
Malik

(10) Patent No.: US 6,541,346 B2
(45) Date of Patent: Apr. 1, 2003

(54) METHOD AND APPARATUS FOR A SELF-ALIGNED HETEROJUNCTION BIPOLAR TRANSISTOR USING DIELECTRIC ASSISTED METAL LIFTOFF PROCESS

(76) Inventor: Roger J. Malik, 191 Mountain Ave., Warren, NJ (US) 07059

( * ) Notice: Subject to any disclaimer, the term of this patent is extended or adjusted under 35 U.S.C. 154(b) by 0 days.

(21) Appl. No.: 09/813,293

(22) Filed: Mar. 20, 2001

(65) Prior Publication Data

US 2002/0155670 A1 Oct. 24, 2002

(51) Int. Cl.⁷ .................. H01L 21/331; H01L 21/8222
(52) U.S. Cl. .................. 438/316; 438/235; 257/12; 257/194
(58) Field of Search .................. 438/316, 312, 438/337, 343, 235, 172; 257/12, 194, 197

(56) References Cited

U.S. PATENT DOCUMENTS

| 3,634,647 A | 1/1972 | Dale, Jr. |
| 4,518,846 A | 5/1985 | Freeouf et al. |
| 4,550,411 A | 10/1985 | Stonestreet et al. |
| 4,553,022 A | 11/1985 | Colombo |
| 4,812,326 A | 3/1989 | Tsukazaki et al. |
| 4,813,373 A | 3/1989 | Demay et al. |
| 4,818,712 A | 4/1989 | Tully |
| 4,996,165 A | 2/1991 | Chang et al. |
| 5,001,534 A | 3/1991 | Lunardi et al. |
| 5,034,604 A | 7/1991 | Streetman et al. |
| 5,185,274 A | 2/1993 | Chang et al. |
| 5,187,110 A * | 2/1993 | Aina et al. .................. 438/235 |
| 5,253,266 A | 10/1993 | Knodle, III et al. |
| 5,318,916 A | 6/1994 | Enquist et al. |
| 5,404,028 A | 4/1995 | Metzger et al. |
| 5,412,233 A | 5/1995 | Dubon-Chevallier et al. |
| 5,471,078 A | 11/1995 | Bayraktaroglu |
| 5,558,720 A | 9/1996 | Sarraf et al. |
| 5,569,944 A | 10/1996 | Delaney et al. |
| 5,648,666 A * | 7/1997 | Tran et al. .................. 257/197 |

(List continued on next page.)

OTHER PUBLICATIONS

C. Bozada, T. Jenkins, J. Gillespie, J. Sewell, R. Welch, D. Via, T. Quach, and R. Dettmer, "AFRL's Thermally Shunted Heterojunction Bipolar Transistors," National Aerospace & Electronics Conf., Tutorial #2, Jul. 13–17, 1998, IEEE Press, Piscataway, NJ (1998).

(List continued on next page.)

Primary Examiner—Olik Chaudhuri
Assistant Examiner—Fernando Toledo
(74) Attorney, Agent, or Firm—Ward & Olivo

(57) ABSTRACT

Disclosed is a manufacturing method to fabricate Heterojunction Bipolar Transistors (HBTs) that enables self-alignment of emitter and base metal contact layers with precise sub-micron spacing using a dielectric-assisted metal lift-off process. Such an HBT process relies on the formation of an "H-shaped" dielectric (i.e., $Si_3N_4/SiO_2$) mask conformally deposited on top of the emitter contact metalization that is used to remove excess base metal through lift-off by a wet chemical HF-based etch. This HBT process also uses a thin selective etch-stop layer buried within the emitter layer to prevent wet chemical over-etching to the base and improves HBT reliability by forming a non-conducting, depleted ledge above the extrinsic base layer. The geometry of the self-aligned emitter and base metal contacts in the HBT insures conformal coverage of dielectric encapsulation films, preferably $Si_3N_4$ and/or $SiO_2$, for reliable HBT emitter p-n junction passivation. Thus, the disclosed HBT process enables scaling of narrow emitter stripe widths down to sub-micron dimensions producing transistors with cut-off frequencies in the range of several hundred GigaHertz.

61 Claims, 8 Drawing Sheets

U.S. PATENT DOCUMENTS

| | | | |
|---|---|---|---|
| 5,668,388 A | * 9/1997 | Delage et al. | 257/197 |
| 5,698,871 A | 12/1997 | Sakai et al. | |
| 5,717,228 A | 2/1998 | Matsuoka et al. | |
| 5,729,033 A | 3/1998 | Hafizi | |
| 5,734,193 A | 3/1998 | Bayraktaroglu et al. | |
| 5,804,487 A | 9/1998 | Lammert | |
| 5,892,248 A | 4/1999 | Oki et al. | |
| 5,943,577 A | 8/1999 | Contrata et al. | |
| 5,981,985 A | 11/1999 | Yang et al. | |
| 5,994,194 A | 11/1999 | Lammert | |
| 6,031,255 A | * 2/2000 | Delage et al. | 257/198 |
| 6,081,003 A | * 6/2000 | Miyakuni et al. | 257/197 |
| 6,384,499 B2 | * 5/2002 | Yamaguchi | 310/81 |
| 6,465,870 B2 | * 10/2002 | Voldman | 257/565 |

OTHER PUBLICATIONS

R.J. Malik Et Al., "Submicron Scaling of AlGaAs/GaAs Self–Aligned Thin Emitter Heterojunction Bipolar Transistor (SATE–HBT) with Current Gain Independent of Emitter Area," Electron. Lett., 25, 1175 (1989).

T. Lester Et Al., "A Manufacturable Process for HBT Circuits," Proc. 20th Intl. Symp. on Gallium Arsenide and Related Compounds, Freiburg, Germany (1993).

S. Tiwari, "Heterostructure Bipolar Transistors," Chap. in Compound Semiconductor Device Physics, Academic Press, New York (1992).

H. Kroemer, "Heterostructure Bipolar Transistors and Integrated Circuits," Proc. IEEE, 70, 13 (1982).

M. Das, "HBT Device Physics and Models," Chap. in HEMTs and HBTs: Devices, Fabrication, and Circuits, F. Ali and A. Gupta, editors, Artech House, Norwood, MA (1990).

K. Kobayashi Et Al., "Indium Phosphide Heterojuction Bipolar Transistor Technology for Future Telecommunications Applications," Microwave Journal, 74 Jul. (1999).

L. Camnitz and N. Moll, "An Analysis of the Cut–off Frequency Behaviour of Microwave Heterostructure Bipolar Transistors," Chap. in Compound Semiconductor Transistors: Physics and Technology, S. Tiwari, editor, IEEE Press, Piscataway, NJ (1993).

R. Ryan Et Al., "Dielectric Assisted Trilayer Lift–off Process", J. Vac. Sci. Tech. B., (1998).

S. Thomas Et Al., "Fabrication of InP–based HBT integrated circuits", Proc. Intl. Symp. on Indium Phosphide and Related Materials, Williamsburg, VA, 286, IEEE Press, Piscataway, NJ (2000).

* cited by examiner

METHOD AND APPARATUS FOR A SELF-ALIGNED HETEROJUNCTION BIPOLAR TRANSISTOR USING DIELECTRIC ASSISTED METAL LIFTOFF PROCESS

TECHNICAL FIELD OF THE INVENTION

The present invention relates to semiconductor transistors used in the fabrication of very high-speed integrated circuits and microwave power amplifiers. More particularly, the invention pertains to compound semiconductor transistors made from GaAs and InP and related lattice-matched materials epitaxially grown on semi-insulating substrates.

BACKGROUND OF THE INVENTION

Transistors are multielectrode semiconductor devices in which the current flowing between two specified electrodes is controlled or modulated by the voltage applied at a third (control) electrode. Transistors fall into two major classes: the bipolar junction transistor (BJT) and the field-effect transistor (FET). BJTs were derived from the point-contact transistor, which was invented at Bell Telephone Laboratories in 1947 by Bardeen, Brattain, and Shockley. BJTs comprise two p-n junctions placed back-to-back in close proximity to each other, with one of the regions common to both junctions. This forms either a p-n-p or n-p-n transistor comprising three regions—emitter, base and collector. The BJT utilizes the flow of both electrons and holes across the p-n junctions for its electrical behavior. That is, the current flow through the emitter and collector electrodes is controlled by the voltage across the base-emitter p-n junction.

In normal (or forward active) operation of a BJT, the base-emitter p-n junction is forward biased and the base-collector junction is reverse biased. Majority-carrier current flows across the forward-biased emitter-base junction. The emitter is much more heavily doped than the base region, so that most of the total current flow across the base-emitter junction consists of majority carriers from the emitter injected into the base. These injected carriers become minority carriers in the base region, and will tend to recombine. Such recombination is minimized by making the base region very narrow, so that the injected carriers can diffuse across the base to the reverse-biased base-collector junction, where they are swept across the junction into the collector, to appear in the outside circuit as the collector current. The magnitude of this collector current depends on the number of majority carriers injected into the base from the emitter, and thus current is controlled by the base-emitter p-n junction voltage. The output (collector) current is therefore controlled by the input (base-emitter) voltage, and the output circuit of the transistor can be modeled as a voltage-controlled current source (dependent sources), while the input circuit looks like a p-n junction diode.

In principle, the transistor can be operated in reverse active mode by reversing the connections. However, in practice, the transistor is not completely symmetrical. That is, the the emitter is very heavily doped to maximize emitter injection, and the collector is relatively lightly doped so that it can accommodate large voltage swings across its reverse-biased junction. While the electrical characteristics are similar in appearance, the forward characteristics show much greater gain, as expected.

If both junctions are reverse biased, the transistor behaves like an open switch, with only the p-n junction reverse leakage currents flowing. If both junctions are forward biased, there is injection of carriers into the base region from both sides, and a low resistance is presented to current flow in either direction: the transistor behaves like a closed switch, and the base stores the injected charge.

BJTs can be used to provide linear voltage and current amplification: small variations of the base-emitter voltage and hence the base current at the input terminal result in large variations of the output collector current. Since the transistor output has the appearance of a current source, the collector can drive a load resistance and develop an output voltage across this resistance (within the limits of the supply voltage). The transistor can also be used as a switch in digital logic and power switching applications, switching from a high-impedance 'off' state in cut-off, to a low-impedance 'on' state in saturation. In practice, full saturation conditions of base-collector forward biased are generally avoided, to limit the carrier storage in the base and reduce the switching time. Such BJTs find application in analog and digital circuits and integrated circuits, at all frequencies from audio to radio frequency. For higher frequencies, such as microwave applications, heterojunction bipolar transistors (HBTs) are used.

HBTs are bipolar junction transistor which incorporate a wide band gap emitter, where the emitter-base junction is a heterojunction between semiconductors of different energy band gaps. The following are typical materials for HBTs: aluminum-gallium-arsenide (AlGaAs)(emitter)/gallium-arsenide (GaAs)(base); aluminum-indium-arsenide (AlInAs)/indiumgallium-arsenide (InGaAs); Si/silicon-germanium (SiGe); and indium-gallium-phosphide (InGaP)/GaAs; indium-phosphide (InP)/InGaAs. The wider band gap of the emitter significantly reduces the injection of majority carriers from the base to the emitter, thus maximizing the desired injection of carriers from the emitter to the base. This eliminates the requirement for a heavily doped emitter to achieve the same result, and consequently allows the based doping to be increased. An increase in base doping is desirable from a device viewpoint, as the base resistance can be reduced significantly. This leads to an improvement in the high-frequency performance of the transistor. HBTs are typically used at radio- and microwave frequencies, in integrated circuits (ICs), power applications, optoelectronic ICs, etc.

Compound semiconductor (e.g., GaAs, InP, etc.) HBTs play an important role in present day communications systems. They have been used extensively for power amplifiers in cell phones due to superior efficiency (i.e., longer battery life) and improved linearity (i.e., less distortion and longer operation range) in comparison to standard Si transistor technology. Also, such compound semiconductor HBTs are used in ultra-high speed digital ICs (i.e., operating at 10 Gigabit/sec) for fiber optic communications systems for telecom and Internet backbone transmission. Future generation fiber optic systems are targeted for 40, 80 and 160 Gigabit/sec applications that are well beyond the speeds of silicon (Si) IC technologies. In addition, HBTs may be used in phased-array radar and very high frequency terrestrial and satellite communication systems, and the reliability of HBT devices is not sufficient to incorporate these ICs into such applications, primarily due to the limitations of present HBT process technologies.

HBTs manufactured from compound semiconductor epitaxial layers including AlGaAs/GaAs, InGaP/GaAs, AlInAs/InGaAs, and InP/InGaAs have produced the world's fastest semiconductor transistors with cut-off frequencies of several hundred GigaHertz (GHz) and operating IC speeds above 80 GHz. See, for example, M. Rodwell, "Transferred Substrate InP HBT Technology", Proceedings from the International Symposium on Indium Phosphide and Related Materials, Williamsburg, Va., 286, IEEE Press (2000). Compound semiconductor HBTs are of great commercial interest for very high-speed optical fiber digital communication systems operating at and above 10 Gigabit/sec, in microwave and millimeter-wave transmitters and receivers, and in high-power X-band (10 GHz) microwave radar systems. Recently, the intrinsic cut-off frequencies of Si bipolar junction transistors (BJTs) and SiGe HBTs have increased to the range of 100 GHz by submicron scaling of the emitter dimensions with reported emitter stripe widths as small as 0.25 µm. However, Si BJTs and SiGe HBTs suffer from several performance disadvantages in comparison to compound semiconductor HBTs, including, for example, low collector breakdown voltages and the inability to integrate passive components in ICs including resistors, capacitors, and inductors due to the lossy, conductive Si substrate. Therefore, HBTs fabricated from compound semiconductor layers grown on semi-insulating substrates are expected to continue to dominate the commercial market in very high-speed digital ICs and in very high-frequency radio frequency (RF) applications. The schematic cross-section of a typical prior art compound semiconductor HBT that has been previously fabricated in a number of industrial, government, and academic research laboratories is shown in FIG. 1, having base 19, emitter 17 and collector 10 contacts. Such an N-type/p-type/n-type (n-p-n) HBT epitaxial wafer structure may be grown by Molecular Beam Epitaxy (MBE) or by Metal Organic Chemical Vapor Deposition (MOCVD) on a semi-insulating substrate 11. The epitaxial layers for the n-p-n HBT structure shown in FIG. 1 are conventionally grown in the following sequence: (1) highly doped n+ subcollector 12, (2) low doped n collector 13, (3) highly doped p+ base 14, (4) wide bandgap n emitter 15, and (5) highly doped n+ emitter contact 16. In some cases, the wide bandgap collector region 13 is used to improve the collector breakdown voltage.

The processing of the n-p-n HBT relies upon the use of the emitter metal contact 17 to serve as an etch mask to remove the emitter material down to the base layer 14. The area of the emitter p-n junction is defined by the emitter metal contact wherein the emitter metal is used to form lateral emitter undercuts 8 by wet chemical etch during the etch down to the base layer 14. For small area emitter p-n junction HBTs, Reactive Ion Etching (RIE) is sometimes first used to vertically etch the emitter semiconductor material followed by a wet etch to form the lateral emitter undercuts 8. This HBT process results in the so-called "T-shaped" emitter structure, and allows for a convenient method to obtain self-alignment of the base and emitter contacts by shadow evaporation of base metal 18 over the emitter metal 17.

A magnified schematic cross-section of the etched emitter p-n junction and emitter and base metal contacts is shown in FIG. 2. As shown, the base and emitter metal contacts will not bridge and hence short circuit as long as the base metal thickness is less than the vertical height of the semiconductor layer removed during the emitter etch (i.e., the combined thickness of wide bandgap n emitter 15 and highly doped n+ emitter contact 16), thereby providing vertical openings 22 between the base and the emitter metals. The separation between the base metal and semiconductor emitter p-n junction (i.e., at emitters 15 and 16) is determined by the emitter undercuts D 8 produced by lateral wet etching during the etch to the base layer.

The advantages of this simple HBT process are several-fold. Sub-micron spacing between base metal 18 and emitter p-n junction 15 can be readily achieved without the need for realignment of the base contacts by use of high-resolution projection photolithography. The narrow separation of the emitter undercuts 8 between the base metal contacts and emitter p-n junction also reduces the base access resistance that is an important parasitic component determining the RF performance of the n-p-n HBT. For example, the total base resistance, $R_B$, for two base finger contacts straddling an emitter contact can be expressed generally as:

$$R_B = R_{Bcon} + R_{Baccess} + R_{Bint} \qquad (1)$$

and more specifically as:

$$R_B = R_{con}/2L + R_{Bsheet}D/2L + R_{Bsheet}W/12L \qquad (2)$$

where $R_{con}$ is the base metal contact resistance in ohms, $R_{Baccess}$ is the resistance drop between the base contact and the emitter semiconductor in ohms, $R_{Bint}$ is the intrinsic resistance drop of the base under the emitter semiconductor in ohms, $R_{con}$ is the specific base metal contact resistance in ohm-microns, $R_{Bsheet}$ is the two-dimensional base sheet resistance in ohms, D is the emitter undercut of the emitter metal in microns, W is the width of the emitter contact stripe in microns, and L is the length of the emitter contact stripe in microns. The importance of minimizing the emitter undercut D between the base metal contact and the emitter p-n junction is readily seen from Equation (2). For a typical high frequency n-p-n HBT design, the emitter stripe width W=1 µm. Therefore, if D=W/6=0.1667 µm, the total base resistance, $R_B$, will be twice that of the intrinsic base resistance value assuming the base contact resistance is relatively small.

The effect of the total base resistance $R_B$ on the maximum oscillation frequency of an HBT for an IC can be expressed as:

$$F_{max} = (F_t/8\pi R_B C_T) \qquad (3)$$

where $F_{max}$ is the maximum oscillation frequency which defines the highest possible operating frequency for an IC in Hertz (Hz), $F_t$ is the transit time frequency in Hz, $R_B$ is the total base resistance in ohms, and $C_T$ is the total of the emitter and collector junction capacitances in farads. From Equation (3), it is evident that in order to achieve the highest $F_{max}$ value, the total base resistance, $R_B$, and emitter and collector junction capacitances must be reduced by lateral (or horizontal) device scaling and the transit time frequency $F_t$ should be reduced by vertical device scaling.

Although the "T-shaped" emitter HBT has resulted in ICs with world record speeds in the research laboratory, they suffer from several different manufacturing and processing problems that will ultimately limit their use in commercial high-speed IC applications. One such problem is the difficulty in controlling the emitter undercuts 8 by the edge of emitter metal 17 and the surface edge profile of the emitter p-n junction at emitter layers 15 and 16, as illustrated in FIG. 2. The difficulty encountered in using the emitter contact metal 17 for the emitter etch mask is caused by the enhanced electrochemical etch rate under the emitter metal. The emitter metal mask 17, the electrolyte formed by the chemical etchant, and the semiconductor surface (at 14, 15 and 16) form a galvanic cell due to the difference in the surface potential voltages of the metal and semiconductor. The resultant ionic current flow in the electrolyte etchant greatly accelerates the lateral etch rate of the semiconductor (at 15 and 16) under the emitter metal mask 17. Such enhanced lateral etch rates increased to as much as 500% over the normal vertical etch rate of the semiconductor covered by either photoresist or dielectric (e.g., silicon nitride ($Si_3N_4$) or silicon dioxide ($SiO_2$) masks have been observed. This enhanced lateral etch rate under emitter metal 17 makes it extremely difficult to reproduce the emitter undercut of emitter metal 17 that is a critical parameter for RF performance of the HBT.

Also, the emitter undercut impedes the ability to deposit a conformal dielectric coating of $Si_3N_4$ and/or $SiO_2$ that is considered to be essential for proper passivation of the emitter p-n junction. It is often seen that the deposition of dielectric or polymer films 9 leads to formation of voids 21 at the critical emitter p-n junction due to the narrow opening H 22 between the base 18 and emitter 17 metals. The inability to completely fill the emitter undercut can result in significantly reduced reliability and lifetimes of the HBT device, thereby precluding their use in many IC applications. This severe problem is further discussed below.

Another significant disadvantage to the "T-shaped" emitter HBT process is that it also greatly impedes process control since the undercut of the emitter metal is hidden from the surface. This makes it virtually impossible to accurately measure the undercut 8 in an HBT semiconductor process line. Metrology tools such as Scanning Electron Microscopy (SEM) and Atomic Force Microscopy (AFM) are normally used to measure critical dimensions in semiconductor processing to obtain good process control and high IC yields. However, AFM cannot be used to measure the emitter undercut in the "T-shaped" HBT process because the AFM probe tip cannot penetrate below the emitter metal in the emitter undercut region. Also, SEM imaging of a tilted wafer cannot be used to accurately measure the emitter undercut due to the shadowing effect of the emitter metal in the collection of secondary electrons.

Another difficult and potentially fatal HBT reliability problem results from the use of conventional hydrochloric acid (HCl)-based wet etch chemistries to selectively etch the emitter layers containing AlInAs, InP, or InGaP regions while stopping at InGaAs or GaAs layers that form the p-type base layer. Selective etches are often used in the emitter etch process to prevent over-etching into the base region that would lead to variations in the base resistance and thus greatly reduce IC yields. The kinetics for etching with HCl-based wet chemical etches is reaction rate limited leading to highly anisotropic etch profiles. The observed etch rates are significantly slower on the low index (111A), (2111A), or (311A) Ga-terminated crystal planes which contain the lowest densities of bonding electrons. Thus, the resultant etch profile for the semiconductor emitter p-n junction will have reentrant etch surfaces defined by these low index crystal planes along one of the directions of the emitter metal stripe.

The problem of properly passivating the emitter junction with a reentrant semiconductor surface is illustrated in FIG. 2. Plasma-Enhanced Chemical Vapor Deposition (PECVD) is conventionally used to deposit refractory dielectric films such as $Si_3N_4$ or $SiO_2$ or silicon oxinitride ($SiO_xN_y$) for p-n junction passivation in compound semiconductor devices. In the "T-shaped" emitter HBT process, however, there is a very narrow opening H 22 between the base metal 18 and emitter metal 17 in which the plasma gas can flow to fill in the emitter undercut 8. In addition, the base metal 18 and/or emitter metal 17 serves as a RF shield effectively screening the plasma and decreasing the ion density in the vicinity of the contacts. This leads to incomplete PECVD dielectric coverage under the emitter metal 17 in the undercut 8 resulting in voids 21 at the critical emitter p-n junction. The lack of complete dielectric passivation of the emitter p-n junction will severely degrade the reliability of the HBT leading to short device lifetimes that will preclude their use in many high-speed IC applications.

The inability to properly passivate the emitter p-n junction with a dielectric (e.g., $Si_3N_4$, $SiO_2$ $SiO_xN_y$, etc.) using PECVD has led some researchers to try depositing polymer films 9 such as polyimide (manufactured by DuPont) or Bis Cyclobutyl Butene (BCB) (manufactured by Dow Chemical) or spin-on glass to fill in the emitter undercut 8. However, it is still often observed that these polymer films 9 cannot always penetrate into the undercut 8 region through the narrow opening H 22 due to the surface tension of the polymer films. This, too, directly results in the formation of voids 21 at the critical emitter p-n junction that greatly decreases the HBT device reliability. Moreover, even if the polymer film 9 could fill in the emitter undercut 8, the critical problem of emitter p-n junction passivation is not solved. That is, these polymers are known to contain and are permeable to water vapor. Thus, water vapor can diffuse to the emitter p-n junction and further oxidize the semiconductor surface leading to increasing base surface recombination currents that will result in eventual HBT device failure.

Another disadvantage to these polymer films is that they are not true passivation films since they do not form strong chemical bonds with the semiconductor surface. For instance, it is well known that compound semiconductor surfaces contain a thin layer (1–3 nm) of native oxides formed from the constituent semiconductor elements during processing. In the case of spun-on polymer films, these layers only serve to overcoat the semiconductor native oxides and do not stabilize the semiconductor surface from further decomposition through oxidation in the presence of water vapor. This water vapor oxidation process of the semiconductor surface can be thermally-activated by heat caused by device power dissipation and/or can be electrically-activated by current flow at the surface of the emitter p-n junction. For the case of PECVD dielectric films, the deposition process actually removes the native oxides by chemical reaction with atomic hydrogen (H), which is present in plasma gas, before forming stable nitrogen (N) or oxygen (O) bonds with the semiconductor surface. These refractory dielectric films also form a hermetic seal preventing water vapor from reaching the semiconductor surface—water that can lead to deterioration of the emitter p-n junction and degrade the HBT's reliability.

These aspects of emitter p-n junction passivation are especially critical for very high nil frequency HBTs since ICs will operate at very high current densities and high junction temperatures. The emitter perimeter surface area to active p-n junction area ratio is also much larger in small-area, high cutoff frequency HBTs leaving them particularly susceptible to enhanced base surface recombination currents resulting in lower current gains. Thus, the use of refractory $Si_3N_4$ or $SiO_2$ dielectric films for emitter p-n junction passivation is considered to be an essential and critical aspect for HBT device reliability and must be incorporated in the HBT process technology. Another very important processing step for proper passivation of the HBT emitter p-n junction is the inclusion of a non-conducting, depleted and thinned emitter region or emitter "ledge" on top of the extrinsic base surface adjacent to the conducting emitter layer. See, R.J. Malik et al., "Self-Aligned Thin Emitter Heterojunction Bipolar Transistor (SATE-HBT) with Current Gain Independent of Emitter Area", Electron. Lett., 25, 1175 (1989). This is a required process step to prevent minority carrier electrons injected into the base from recombining at surface states that would occur if the extrinsic base surface were exposed during the etch process. HBTs fabricated without this depleted ledge have been found to have seriously degraded operating lifetimes due to surface recombination. Therefore, all current industrial HBT manufacturing processes include this depleted ledge to produce HBTs with good reliability and long operating lifetimes. The formation of the depleted emitter ledge is normally accomplished by thinning the semiconductor emitter layer by a timed wet chemical etch which stops approximately 10–20 nm before reaching the base layer. For a non-self-aligned HBT process, the base metal is deposited through a shallow trench etched through the depleted emitter "ledge" that is defined using photolithography.

Next, the process steps used to form metal ohmic contacts to the HBT often determine the overall yield of functional discrete devices and ICs. Compound semiconductor process technology relies upon the use of gold-based (Au-based) metal contacts typically deposited by evaporation through a patterned photoresist mask that is defined by photolithography. The excess metal is removed by chemically dissolving the photoresist underneath the metal in what is known as a "lift-off" process. This is because conventional wet chemical and plasma etches for gold (Au) and related metals will also aggressively etch compound semiconductors such as GaAs and InP and are thus not compatible in this process technology. This can be compared to Si process technology where metal contacts are normally defined by blanket deposition of the metal by evaporation or sputtering and subsequent reactive ion etching (RIE) using a patterned photoresist mask.

The compound semiconductor metal lift-off process suffers from several disadvantages. For example, the resultant metal profile is often found not to have a flat topped surface but rather has high extending metal edges 28 (or "wings") typically on one side of the metal feature 36, such as the emitter metal, as illustrated in FIG. 3. This is caused by the deposition geometry of the thermally heated or electron beam heated Au evaporation source, as depicted in FIG. 4. In FIG. 4, it is shown that the direction of the evaporated metal from the crucible 42 is along a vector Z 44 at an incident angle θ 47 with respect to the surface normal of the substrate 41. Incident angle θ 47 may be calculated as follows:

$$\theta = \tan^{-1}(X/Y) \quad (4)$$

where θ is the incident angle 47, Y is the surface normal distance from the evaporated metal crucible 42 to the substrate 41, and X 46 is the lateral distance which the incident beam has diverged from the surface normal of the substrate 41. This results in some metal being deposited on the sidewall of the photoresist pattern that forms the extending metal edges 28 (or "wings") (FIG. 3) on at least one edge of the metal, which can be as high as the thickness of the photoresist film. This is especially problematic when depositing thick metal layers or when defining narrow metal stripes with widths less than or equal to 1 micron. The high metal edges have a tendency to break off during subsequent process steps that can result in short circuits in the transistor structure that can greatly decrease discrete device and IC yields.

The following describes some known HBT manufacturing and processing methods. For example, Contrata et al. U.S. Pat. No. 5,943,577 (Contrata) discloses a method of making HBT structures having air and implanted isolations to uniformly etch a semiconductor layer regardless of an ultimate circuit configuration. More specifically, Contrata discloses a method of manufacturing a semiconductor device whereby a semiconductor layer having a device forming region is first formed on substrate. Then, a region other than the device forming region is changed into an insulator, and a conducting path is left across the semiconductor device to electrically connect the semiconductor device with an adjacent semiconductor device. Subsequently, the device forming region is etched on the condition that the conducting path is left. Finally, the conducting path is disrupted after the etching process. Thus, the semiconductor device and the adjacent semiconductor device are left in electrical contact via the conducting path during the etching process. Further, complete isolation between the semiconductor devices is carried out by disrupting the conducting path after the etching process.

Lammert U.S. Pat. No. 5,804,487 (Lammert) teaches a method of fabricating high beta HBT devices. Generally, Lammert discloses a method for controlling the spacing between the emitter mesa and the base ohmic metal of an HBT to obtain a relatively high gain (beta) with a low-parasitic base resistance. After the emitter, base and collector layers are epitaxially grown on a substrate, a sacrificial layer is deposited on top of the emitter layer. The emitter mesa is then patterned with a photoresist using conventional lithography, and subsequently, the sacrificial layer is etched to produce an undercut. Next, the emitter layer is etched and a photoresist is applied over the entire device. The top layer of the photoresist is then patterned with a conventional process for lift-off metalization, such that the final resist profile has a reentrant slope. Next, the base ohmic metal is deposited and then lifted off by dissolving both the second layer of photoresist, as well as the original photoresist over the emitter mesa. The sacrificial layer is stripped using an isotropic etch leaving a base ohmic metal region surrounding an emitter mesa at a spacing that is determined by the initial undercut of the sacrificial layer. In an alternate embodiment of the invention, Lammert discloses a method for controlling the spacing between the base ohmic metal and an emitter ohmic metal.

Oki et al. U.S. Pat. No. 5,892,248 (Oki) discloses a method for fabricating an HBT having self-aligned base metal contacts using a double photoresist layer. According to Oki, this process requires fewer steps than other methods, while minimizing damage to the active emitter contact region. In particular, a photoresist is used to form the emitter mesa which is left on while a double polymethylmethacrylate (PMMA) and photoresist layer is applied. The triple photoresist combination is patterned to create a non-critical lateral alignment for the base metal contacts to the emitter mesa, which permits selective base ohmic metal deposition and lift-off. By utilizing the double photoresist as opposed to a metal or dielectric for masking, an additional photolithography step and etching step is eliminated. By eliminating the need for an additional etching step, active regions of the semiconductors are prevented from being exposed to the etching step and possibly damaged.

Hafizi U.S. Pat. No. 5,729,033 (Hafizi) teaches a fully self-aligned submicron HBT and a method of fabricating such an HBT. The fabrication process of Hafizi includes lattice matched growth of subcollector, collector, base, emitter, and emitter cap layers in sequential order on a semi-insulating semiconductor substrate, with the formation of an emitter cap mesa, an emitter/base/collector mesa and a subcollector mesa. Dielectric platforms are then formed extending the base/collector layers laterally and forming sidewalls on the sides of emitter cap mesa and the sides of the extended base/collector layers. Next, undercuts are etched into the emitter layer and the upper portion of the subcollector layer. This forms an overhang on the emitter cap mesa with respect to the emitter layer and an overhang on the base/collector layers with respect to the upper portion of the subcollector layer. The emitter, base and collector contacts are simultaneously formed, with the base contact aligned to the edge of the emitter cap overhang and the collector contact aligned to the edge of the base/collector layer overhang.

Dubon-Chevallier et al. U.S. Pat. No. 5,412,233 (Dubon-Chevallier) discloses an HBT and a process for producing an HBT. Such a process comprises the known steps (or stages) consisting of producing layers forming the collector, base and emitter, as well as collector, base and emitter ohmic contacts. The emitter producing stage consists of depositing, on the base layer, two superposed layers making up the emitter, the first of which is a thin layer made up of a first material having a large energy gap, and the second made up of a second material also having a high energy gap. The base ohmic contact is then deposited on the first layer of the emitter.

Matsuoka et al. U.S. Pat. No. 5,717,228 (Matsuoka) discloses a self-aligned HBT which includes a semiconductor substrate having the (100) plane as a main surface, and at least a collector region, a base region, and an emitter region having a bandgap greater than the base region. According to Matsuoka, the emitter region has an under-cut mesa structure and its crystal orientation is defined in a direction other than that parallel to the (011) direction. The transistor does not have any outwardly slanted structure in either the (001) direction or the (011) direction that could cause current leakage between the emitter and base, thereby providing a transistor with improved electric isolation between the emitter and base, although it is self-aligned.

Bayraktaroglu U.S. Pat. No. 5,471,078 (Bayraktaroglu) teaches a self-aligned HBT and a method of fabricating the same including the epitaxial growth of collector, base and emitter layers, allowing for self-aligned emitter-base contacts to minimize series base resistance and to reduce total base-collector capacitance. More particularly, the method according to Bayraktaroglu is such that the epitaxial in situ doped collector, base and emitter layers are grown over an entire semi-insulating GaAs substrate. The wafer is then covered with a metal emitter contact layer followed by an insulator layer. Next, the emitter areas are patterned and etched down to the emitter epilayer, sidewalls are formed on the resulting islands and the exposed portions of the emitter epilayer are chemically etched down to the base epilayer. Finally, base contacts are deposited and the emitter contact is covered with deposited metal.

Sakai et al. U.S. Pat. No. 5,698,871 (Sakai) discloses an HBT that includes a compound semiconductor substrate, a collector layer disposed on the compound semiconductor substrate, a base layer disposed on the collector layer, the base layer being a semiconductor having a band gap energy and including an internal base region and an external base region, and an emitter layer disposed on the base layer and being a semiconductor having a band gap energy larger than the band gap energy of the semiconductor of the base layer. According to Sakai, the base layer is larger in area than the emitter layer by the external base region. The external base region is sandwiched by insulating films at the external base region. Therefore, without ion-implantation to make the resistance of the collector layer below the external base region higher, i.e., without increasing the base resistance, the base-collector capacitance is reduced, resulting in an HBT having an improved high frequency gain. Yang et al. U.S. Pat. No. 5,981,985 (Yang) teaches an integrated HBT with minimized base-collector capacitance, a sub-collector region is formed as a mesa on a substrate, a collector contact is to the sub-collector mesa region, a lightly-doped collector region and a base region extend from the mesa onto the substrate, and a base contact and its via hole for interconnection are off the mesa, with minimal overlap with the sub-collector region. The latter may be termed a buried selective sub-collector region. Transistors such as this can be used as integrated switching devices and microwave devices, e.g., in wireless communications, satellite direct broadcast systems, automobile collision avoidance systems, global positioning systems, and other high-frequency applications.

Delaney et al. U.S. Pat. No. 5,569,944 (Delaney) discloses, generally, and in one form of the invention, a method for making an HBT comprising the steps of forming a compound semiconductor material structure comprised of a plurality of layers, wherein at least one of the layers comprises a first material (e.g., GaAs) and at least one of the remaining layers comprises a second material (e.g., AlGaAs), and etching the layers comprised of the first material with an etchant that does not appreciably etch the layers of the second material. A surprising aspect of this invention is that no additional etch stop layer was needed in the material structure, because etchants were used that stop on the wide band gap emitter layer (e.g., AlGaAs) usually found in HBTs despite the similarity of the AlGaAs and GaAs layers. According to Delaney, an advantage of this method is that a reference point for timing subsequent etches is established at a point other than the top of the uppermost of the layers, thereby improving the accuracy with which the depth of the subsequent etching can be controlled, which directly relates to more producible and higher yield HBTs.

As discussed above, HBT manufacturing and processing is not new. However, it does suffer from significant disadvantages, as described herein, which greatly hinder the applicability of resulting HBTs to many IC applications. The present invention overcomes these disadvantages by providing a precise means of manufacturing compound semiconductor HBTs having self-aligned emitter and base metal contacts with submicron spacing using a dielectric$ assisted metal liftoff process. Such a novel process provides precise submicron spacing and flat topped surfaces free from disadvantageous metal "wings", improves the reproducibility of the HBT manufacturing process by eliminating the possibility of over-etching to the base layer, and provides an etched emitter p-n junction with the appropriate surface profile that can be properly passivated with a dielectric (e.g., $Si_3N_4$, $SiO_2$, $SiO_xN_y$, etc.) for excellent device reliability.

Moreover, the present invention provides significant advantages not present in previous processes. Some of these advantages include elimination of undercutting the emitter metal during etching, which provides more reliable passivation of the emitter mesa p-n junction, having a lateral etch rate that defines the emitter mesa-base contact separation substantially equal to the vertical etch rate to greatly enhance the HBT process control, utilizing an emitter semiconductor having a built-in Phosphorous-containing layer to prevent over-etching (i.e., into the base) and to provide a depleted emitter "ledge" for greater HBT reliability, completely encapsulating the emitter metal with a dielectric insulating film to, inter alia, prevent sputtering of the emitter contact during RIE, and providing for fabrication of arbitrarily small emitter stripe widths (i.e., down to sub-micron dimensions), which increases the cut-off frequencies of the HBTs to several hundred GigaHertz (GHz).

SUMMARY OF THE INVENTION

The disclosed invention provides a precise means of manufacturing compound semiconductor HBTs with self-aligned emitter and base metal contacts having submicron spacing using a dielectric-assisted metal liftoff process. Specifically, the method according to the invention uses an "H-shaped" dielectric film of, for example, $Si_3N_4$, $SiO_2$, or $SiO_xN_y$, that conformally covers the emitter metal contact post. This insulating layer is used as an etch mask to form the emitter electrical p-n junction. The insulator is then etched using HF etchant to move excess base metal deposited on top of the emitter metal, which does not etch the emitter and base metal contacts deposited on the semiconductor. The "H-shaped" dielectric is formed by a combination of vacuum evaporation and Plasma Enhanced Chemical Vapor Deposition (PECVD) of dielectric films and Reactive Ion Etching (RIE) and wet chemical etching. The dielectric encapsulated emitter metal post also provides a mask for RIE and wet chemical etching of the emitter semiconductor layer with improved etch control and eliminates etching and sputtering of the emitter metal during RIE of the emitter semiconductor layers, as compared to prior art HBT processes. This process results in self-aligned emitter and base contacts absolutely essential to fabricate high frequency HBTs.

Further, the invention uses a thin semiconductor layer (typically<10 nm) inserted within the emitter semiconductor layer at a distance between 10–50 nm from the emitter p-n junction. This thin semiconductor layer acts as an etch-stop during wet chemical etching of the emitter layer for improved process control to prevent over-etching to the base. The resultant thinned emitter region also forms a non-conducting, depleted emitter "ledge" above the extrinsic base region for improved HBT reliability.

Next, base metal is shadow evaporated over the encapsulated emitter metal post, and the excess base metal on top of the dielectric covered emitter metal post is readily lifted off using an HF-based wet chemical etch. The base metal is then sintered through the thin depleted emitter "ledge" to form a low resistance contact to the base layer. The narrow sub-micron separation between the base metal contacts and the emitter layer provides for a low base access resistance enabling high frequency operation of the HBT. PECVD dielectric films (e.g., $Si_3N_4$, $SiO_2$, or $SiO_xN_y$) are used to encapsulate the exposed emitter semiconductor surface and base and emitter metal contacts for improved HBT reliability. Interlayer dielectric deposition and etchback is used to expose the emitter, base, and collector contact posts of the HBT for device interconnection. The subject invention enables scaling of emitter stripe widths down to submicron dimensions to fabricate HBTs with cut-off frequencies of several hundred GHz. The subject invention can be used in the fabrication of HBT digital ICs operating at frequencies above 40 GHz for ultra-high speed optical fiber digital communications systems and in multiple emitter finger HBTs for high-power X-band (10 GHz) amplifiers used in radar electronics.

It is object of the present invention to provide an improved method of manufacturing a self-aligned HBT using a dielectric assisted metal liftoff process, wherein the emitter metal is not undercut during etching, thereby allowing reliable passivation of the emitter mesa p-n junction with a dielectric film (e.g., $Si_3N_4$, $SiO_2$, or $SiO_xN_y$).

Another object of the present invention is to provide an improved method of manufacturing a self-aligned HBT using a dielectric assisted metal liftoff process, wherein the lateral etch rate defining the emitter mesa-base contact separation is equal to the vertical etch rate, due to the elimination of galvanic etching effects from exposed metal, thereby greatly enhancing the HBT process control.

Yet another object of the present invention is to provide an improved method of manufacturing a self-aligned HBT using a dielectric assisted metal liftoff process, wherein the emitter semiconductor has a built-in Phosphorous-containing layer that prevents over-etching to the base and provides a depleted emitter "ledge" for greater HBT reliability.

Still another object of the present invention is to provide an improved method of manufacturing a self-aligned HBT using a dielectric assisted metal liftoff process, wherein the emitter metal is completely encapsulated by the dielectric insulating film, which prevents sputtering of the emitter metal contact during RIE.

Yet another object of the present invention is to provide an improved method of manufacturing a self-aligned HBT using a dielectric assisted metal liftoff process, wherein arbitrarily small emitter stripe widths can be fabricated down to sub-micron dimensions since the emitter metal is not undercut in the process, thereby resulting in HBTs having cut-off frequencies of several hundred GHz (e.g., for GaAs, InP, etc. HBTs).

Yet another object of the present invention is to provide an improved method of manufacturing a self-aligned HBT using a dielectric assisted metal liftoff process, including the deposition of Au metal layers for the emitter and base contacts of the HBT with precise submicron spacing and flat topped surfaces free from the disadvantageous metal "wings".

Still another object of the present invention is to provide an improved method for producing a depleted emitter "ledge" that greatly improves the reproducibility of the HBT manufacturing process by eliminating the possibility of over-etching to the base layer.

Yet a further object of the present invention is to provide an etched emitter p-n junction having the appropriate surface profile that can be properly passivated with a dielectric film (e.g., with $Si_3N_4$, $SiO_2$, or $SiO_xN_y$) such that the HBT device reliability is greatly enhanced.

Other objects, features, and characteristics of the present invention, as well as the methods of operation and functions of the related elements of the structure, and the combination of parts and economies of manufacture, will become more apparent upon consideration of the following detailed description with reference to the accompanying drawings, all of which form a part of this specification.

BRIEF DESCRIPTION OF THE DRAWINGS

A further understanding of the present invention can be obtained by reference to a preferred embodiment set forth in the illustrations of the accompanying drawings. Although the illustrated embodiment is merely exemplary of systems for carrying out the present invention, both the organization and method of operation of the invention, in general, together with further objectives and advantages thereof, may be more easily understood by reference to the drawings and the following description. The drawings are not intended to limit the scope of this invention, which is set forth with particularity in the claims as appended or as subsequently amended, but merely to clarify and exemplify the invention.

For a more complete understanding of the present invention, reference is now made to the following drawings in which.

DETAILED DESCRIPTION OF THE PREFERRED EMBODIMENT

As required, a detailed illustrative embodiment of the present invention is disclosed herein. However, techniques, systems and operating structures in accordance with the present invention may be embodied in a wide variety of forms and modes, some of which may be quite different from those in the disclosed embodiment. Consequently, the specific structural and functional details disclosed herein are merely representative, yet in that regard, they are deemed to afford the best embodiment for purposes of disclosure and to provide a basis for the claims herein which define the scope of the present invention. It should be noted that those individuals skilled in the art may be able to make some modifications of the preferred embodiments but which are based upon the underlying teachings contained within this subject invention.

The present invention relates to the method of manufacturing a self-aligned HBT compound semiconductor using a dielectric-assisted metal lift-off process and the resulting HBT device. Generally, the process includes the steps of, first, defining a tri-level mask pattern used to form the emitter contact metal of the HBT. Next, a conformal dielectric coating of, for example, $Si_3N_4$ (glass film) or $SiO_2$ (silicon dioxide) is formed by PECVD (or some other similar known technique) over the entire wafer, which is then etched down to create a dielectric covered emitter metal having a characteristic "H-shaped" pattern. The definition of the base metal is accomplished by having an opening in photoresist, wherein the emitter metal is located, and depositing a thin base metal by thermal evaporation into the opening. The excess base metal on top of the photoresist is then removed by dissolution in acetone. The resultant base metal pattern covering the extrinsic base, wherein the base metal is in contact with the thin P-containing etch stop layer, also covers the dielectric encapsulated emitter metal. Then, the base metal on top of the dielectric encapsulated emitter metal is removed by dissolution of the dielectric encapsulant in an HF-based wet etch. The formation of the ohmic contact to the base region is then accomplished by sintering the base metal. The HBT process proceeds with the definition of the base contact post, and photoresist masks are used to define the base mesa and the sub-collector mesa. The collector contact post is then defined using a photoresist liftoff process. Finally, passivation of the emitter and collector p-n junctions is achieved by deposition of a dielectric film over the entire semiconductor wafer, with the wafer then being planarized in a two-step low temperature spin-on curing process, which is then etched to expose the emitter, base, and sub-collector contacts for device interconnects. The following presents a more detailed description of the preferred embodiment (as well as some alternative embodiments) of the present invention.

Figure 5:
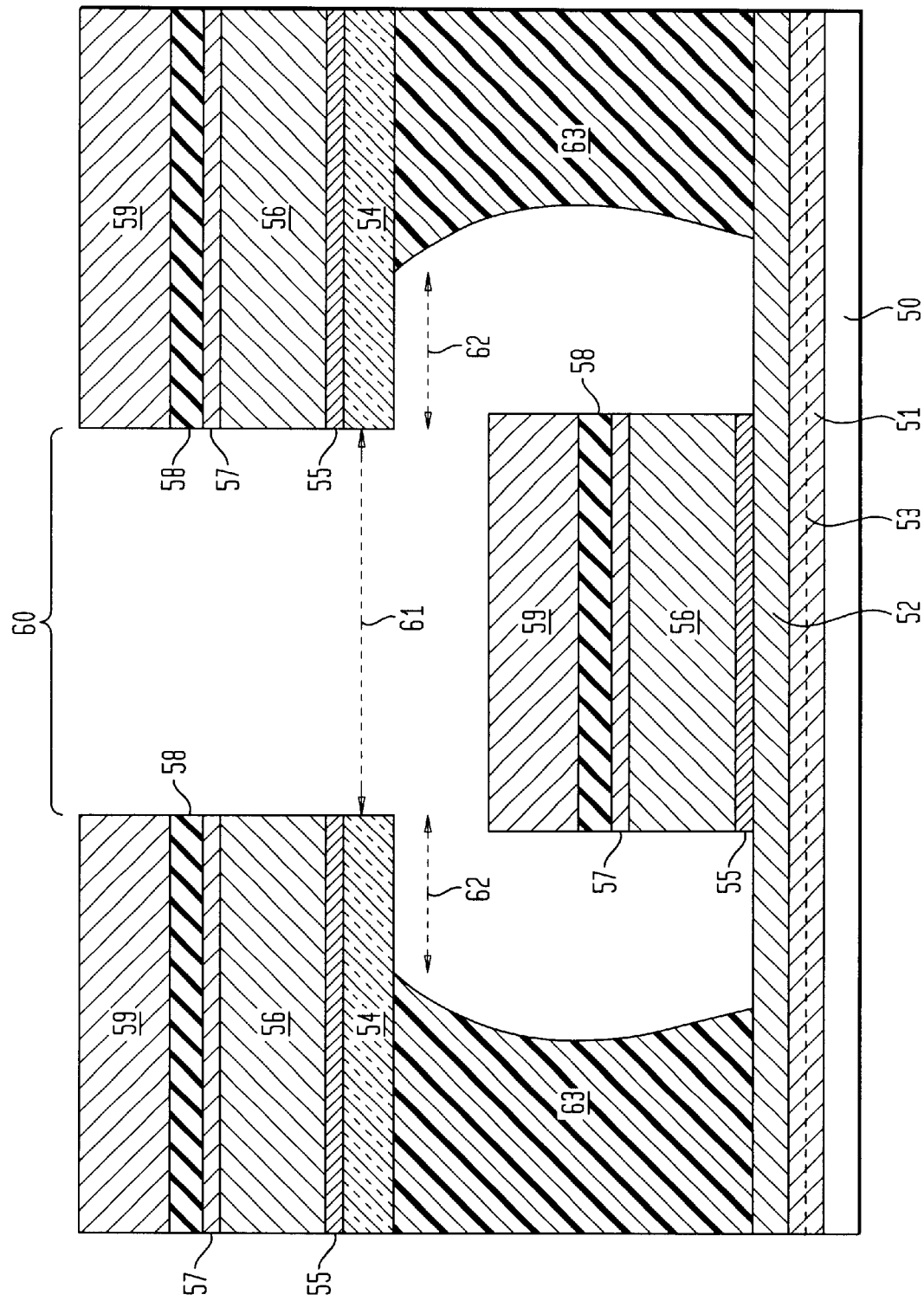
FIG. 5 shows a tri-level mask pattern comprising emitter metal layers and a buried dielectric after vacuum evaporation through a dielectric "stencil" mask and before photoresist lift-off, in accordance with the present invention.

The first process step of the present invention is to define a tri-level mask pattern used to form the emitter contact metal of the HBT. Referring first to FIG. 5, shown is this tri-level mask pattern, which is formed by first depositing a thick photoresist layer 63 (1–2 μm) over the entire semiconductor wafer followed by an oven bake to remove solvents. The semiconductor wafer preferably comprises, as shown, emitter contact layer 52, emitter layer 51 having etch stop layer 53, and base layer 50, although other known semiconductor structures might be in accordance with the present invention. Next a thin (typically 0.1 μm) dielectric film 54 (e.g., $SiO_2$ or glass) is deposited on top of photoresist layer 63, preferably by vacuum evaporation. Alternatively, thin dielectric film 54 could also be deposited by low temperature chemical vapor deposition (CVD), spin-on techniques or by some other known technique for deposition of a material on a substrate. Finally, a thin top photoresist layer (~0.5 μm, not shown in FIG. 5) is deposited on top of dielectric film 54 and the semiconductor wafer is again oven baked to remove any solvents.

Next, the emitter metal opening 60 is defined and formed in the top photoresist film using ultra-violet (UV) photolithography exposure and development. The intermediate dielectric layer 54 is anisotropically plasma etched at low pressure (typically 10–20 mTorr) using F-based etch chemistry down into the lower photoresist layer 63. The semiconductor wafer is then "flood exposed" to UV radiation and thereby developed to form undercuts 62 below the dielectric film 54 (or mask). This UV exposure also removes the top photoresist layer from the entire exposed portion of the semiconductor wafer. The resultant mask pattern acts as a "stencil" for shadow evaporation of the emitter contact stack.

FIG. 5 depicts the emitter contact layer sequence after shadow vacuum evaporation through the "stencil" mask has been performed and before lift-off is performed. The emitter contact layer sequence includes, in order in of deposition: emitter contact metal 55 (preferably comprising, for example, palladium (Pd) or platinum (Pt)) deposited directly on top of the emitter semiconductor contact layer 52, emitter contact 56 (preferably gold (Au)), the metal lift-off layer 57 (preferably comprising titanium (Ti) or aluminum (Al)), insulating layer 58 (for example, $SiO_2$ or glass), and metal layer 59 (preferably, Ti or Al). The excess metal stack on the "stencil" dielectric mask is removed by immersion in a photoresist solvent such as acetone.

Since the underlying photoresist 63 is relatively thick (>1 $\mu$m), the emitter contact stack (or emitter metal stack) can also be made quite thick (~1 $\mu$m) without contacting the photoresist layer 63 due to undercuts 62 of the dielectric mask 54. The primary advantage of using this tri-level mask lift-off process to define the emitter metal stack is that it produces an emitter contact stack having a flat topped surface free from "wings" that would negatively impact subsequent metal lift-off processes and substantially lower yields of functional transistors. In addition, with this tri-level lift-off process, very narrow emitter widths 61 may be patterned in the thin top photoresist layer (e.g., down to at least 0.25 $\mu$m), which can be readily transferred into the dielectric "stencil" mask 54. Such very small dimensions could not be formed in the thick underlying photoresist film 63 by conventional photolithography methods.

Figure 6:
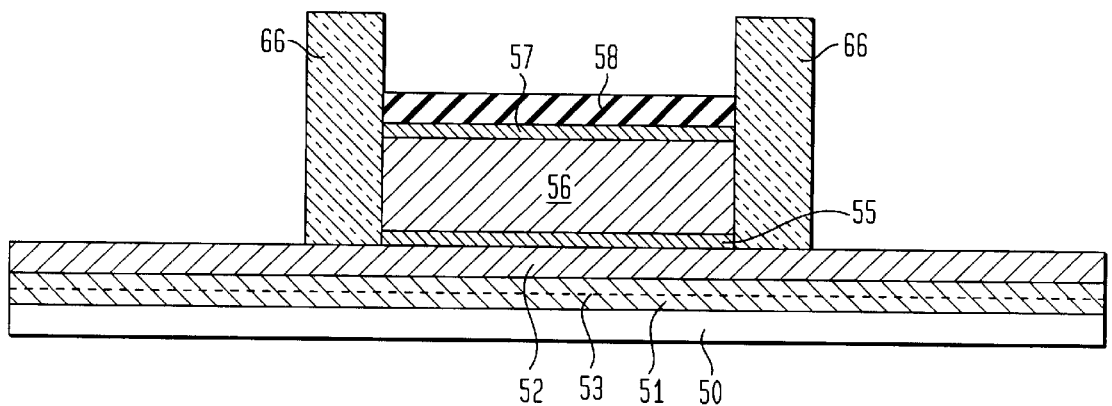
FIG. 6 shows an "H-shaped" dielectric mask covering the emitter metal contact post before emitter etching, in accordance with the present invention.

The next step in the process is to form a conformal dielectric coating of, for example, $Si_3N_4$ or $SiO_2$ by Plasma Enhanced Chemical Vapor Deposition (PECVD) over the entire semiconductor wafer structure. The dielectric film is then anisotropically plasma etched at low pressure (typically 10–20 mTorr) down to the substrate leaving sidewalls 66 on the edges of emitter metal contact 56, as depicted in FIG. 6. The top metal layer 59 (see FIG. 5) is then removed in a wet etch containing HCl down to insulating layer 58. The resultant dielectric covered emitter metal contact 56, having sidewalls 66, before etching the emitter mesa is shown in FIG. 6. As depicted, sidewalls 66 give the resultant dielectric covered emitter metal contact 56 a characteristic "H-shaped" pattern. This mask is then used to define the emitter mesa by etching, and later for lift-off of excess base metal deposited on the top of emitter.

It is advantageous to use a dielectric covered emitter metal for the emitter etch mask because it removes the galvanic effect resulting from exposed metal layers. Removing this galvanic effect results in reduced lateral etch rates. Therefore, the vertical and horizontal etch rates of the semiconductor are substantially the same, producing improved process control. A further advantage to using the dielectric emitter mask is that the footprint of the emitter mesa can thus be made substantially equal to or slightly larger than the emitter contact metal, thereby resulting in a lower current density in the HBT at a fixed current and producing improved device reliability. Yet another advantage to the dielectric emitter mask is that arbitrarily narrow emitter stripes may be made because the emitter metal is not undercut in the definition of the emitter mesa. Yet another advantage of using a dielectric covered emitter metal is that it eliminates etching or sputtering of the emitter metal during dry etching to the base.

Figure 7:
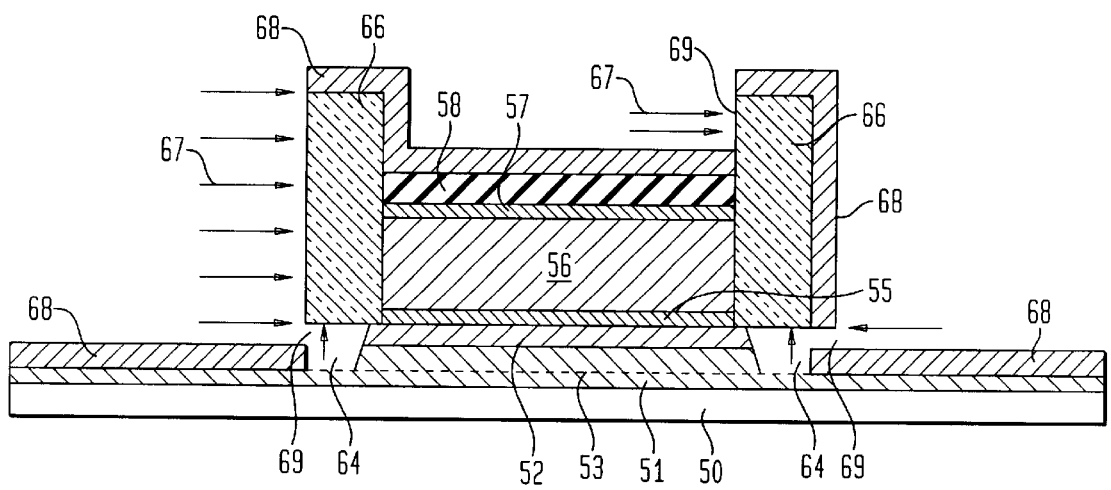
FIG. 7 shows a base metal coating on the "H-shaped" dielectric mask of FIG. 6 before lift-off of excess base metal using an HF-based etchant, in accordance with the present invention.

Referring next to FIG. 7, shown is the "H-shaped" dielectric mask of FIG. 6 after etching of the emitter mesa (defined by emitter contact layer 52 and emitter layer 51 of the semiconductor wafer) and covered with base metal coating 68, but before lift-off of excess base metal 68 using an HF-based etchant. The emitter mesa is defined using a combination of plasma and wet chemical etching. Emitter contact layer 52 and part of the emitter layer 51 are first anisotropically etched using reactive ion etching (RIE) in Cl-based plasma. This results in substantially vertical sidewalls (not shown) substantially coincident with sidewalls 66 covering the emitter metal contact 56. The dielectric covered emitter metal eliminates sputtering of emitter metal contact 56 onto the semiconductor wafer surface, which has been found to impede chemical etching of the emitter layer and cause reliability problems if the emitter metal (e.g., Au) diffuses into the p-n junctions of the HBT.

Next an acid-based wet etch, for example, sulfuric acid ($H_2SO_4$) or phosphoric acid ($H_3PO_4$), containing, for example, hydrogen peroxide ($H_2O_2$) is used to further etch the emitter mesa to selectively stop at a thin (typically <10 nm) Phosphorous (P)-containing etch stop layer 53 located in the emitter layer 51 and to etch under sidewalls 66 to produce undercut 64. The etch stop layer is preferably either a lattice-matched InGaP layer within an AlGaAs emitter layer 51 for a GaAs HBT process or an InP layer within an AlInAs emitter layer 51 for an InP HBT process. In some cases, the P-containing etch stop layer 53 may directly contact the base layer 50. The thickness of the P-containing etch stop layer 53 and the thin remaining portion of emitter layer 51 are chosen such that they are fully depleted of electrons under all HBT bias conditions. These two layers (i.e., etch stop layer 53 and emitter layer 51) that cover the extrinsic base region 50 adjacent to the emitter mesa serve to passivate the surface of base region 50 by eliminating dangling bonds at the emitter p-n junction surface resulting in low recombination currents and improved HBT reliability. During this acid-based wet etch process, sidewalls 66 are horizontally undercut, then depositing base metal 68 provides a break 69 (see FIG. 7) in base metal 68 that is self-aligned to the emitter metal contact 56.

Definition of the base metal 68 is next. This is accomplished by depositing a thin layer of base metal 68 through an opening in photoresist wherein the emitter metal contact 56 is located. This thin base metal 68 is deposited by thermal evaporation into the opening, with the excess base metal on top of the photoresist being removed by dissolution in acetone. The resultant pattern of the base metal 68 is depicted in FIG. 7. As shown, part of the deposited base metal 68 is in contact with the thin P-containing etch stop layer 53 covering the extrinsic base (over the thin portion of emitter layer 51 on base mesa 50). Also, part of the deposited base metal 68 covers the dielectric encapsulated emitter metal contact 56, as shown. As long as base metal 68 is thinner than the etch depth of undercut 64 down to the etch stop layer 53, the base metal 68 will break and not bridge across the top of the dielectric encapsulated emitter metal contact 56. Excess base metal 68 is then readily removed from emitter metal contact 56 by etching in a HF-based wet chemical etch.

Figure 1:
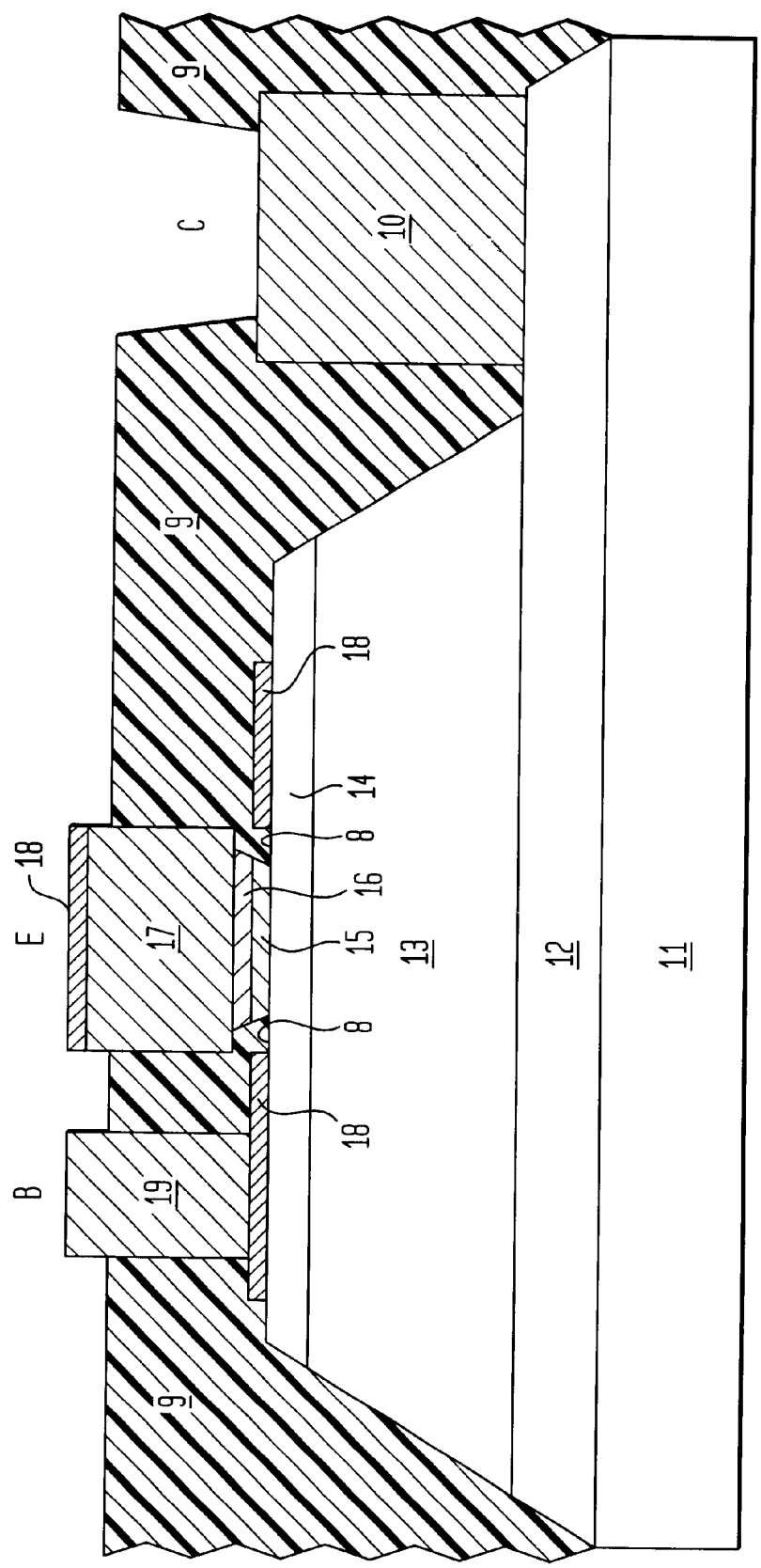
FIG. 1 shows a schematic cross-section of a prior art compound semiconductor HBT manufactured by a prior art "T-shaped" emitter self-aligned HBT process.
Figure 2:
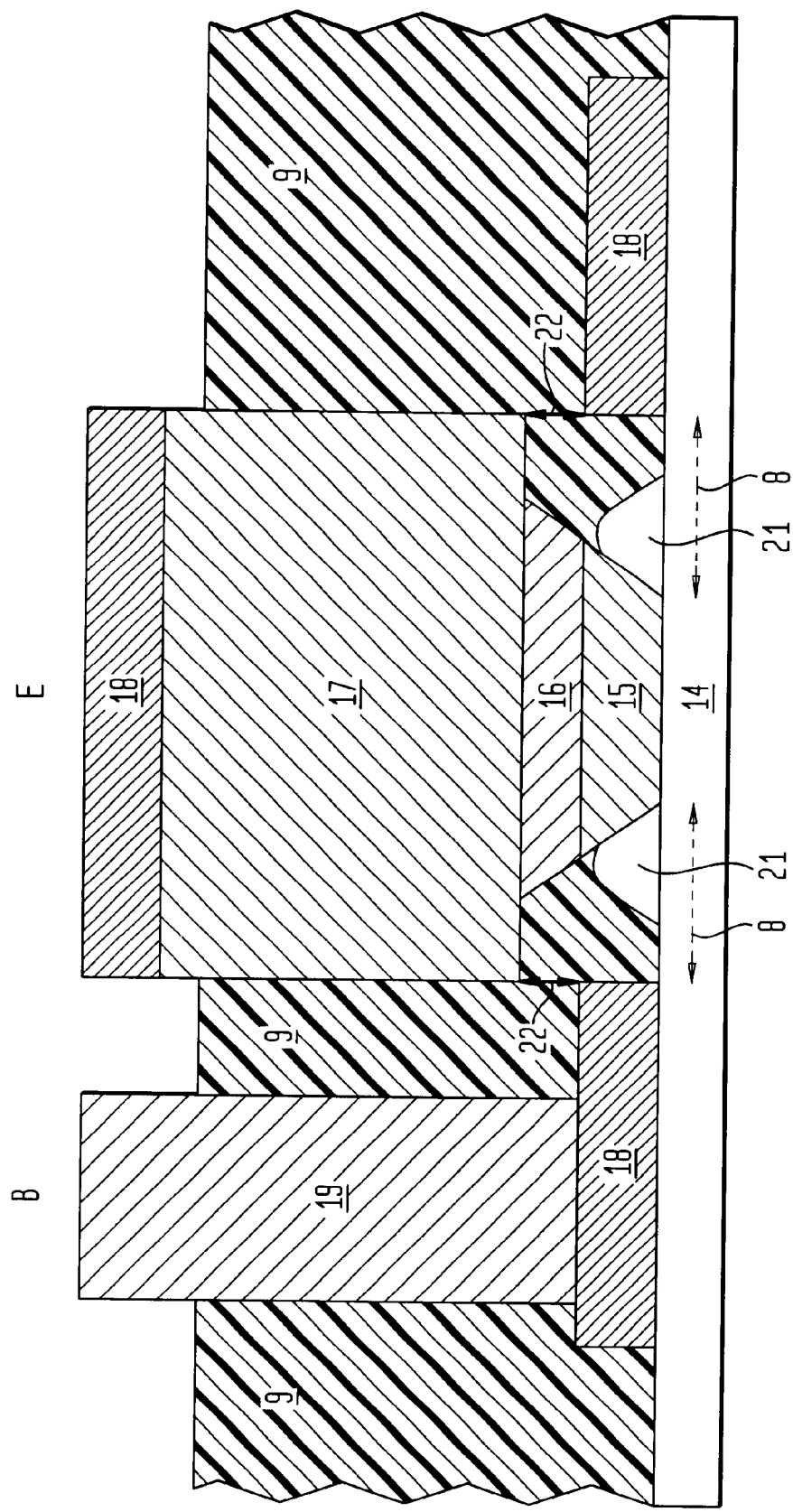
FIG. 2 shows a magnified schematic cross-section of the etched emitter p-n junction and emitter and base metal contacts of the prior art compound semiconductor HBT shown in FIG. 1.
Figure 3:
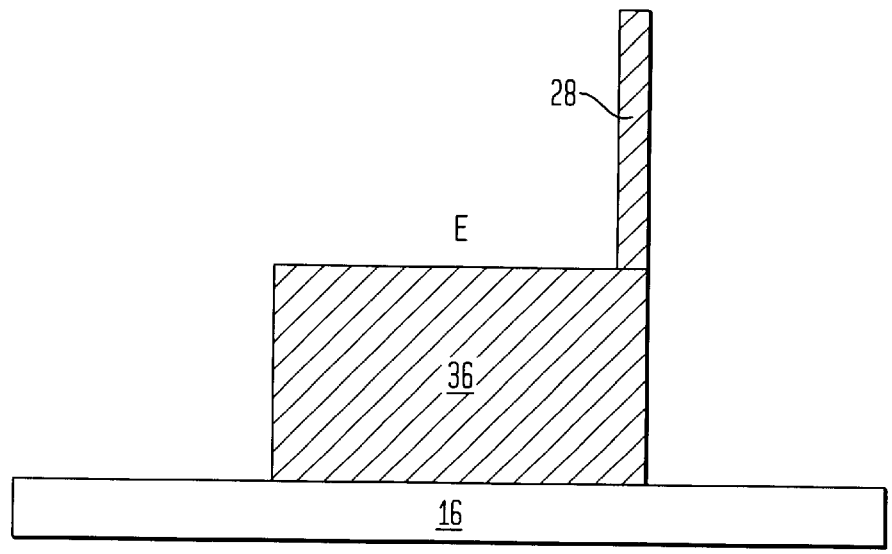
FIG. 3 shows a prior art metal contact layer having attached "wings" formed on one edge of the metal contact due to deposition on the photoresist sidewall and incomplete liftoff.
Figure 4:
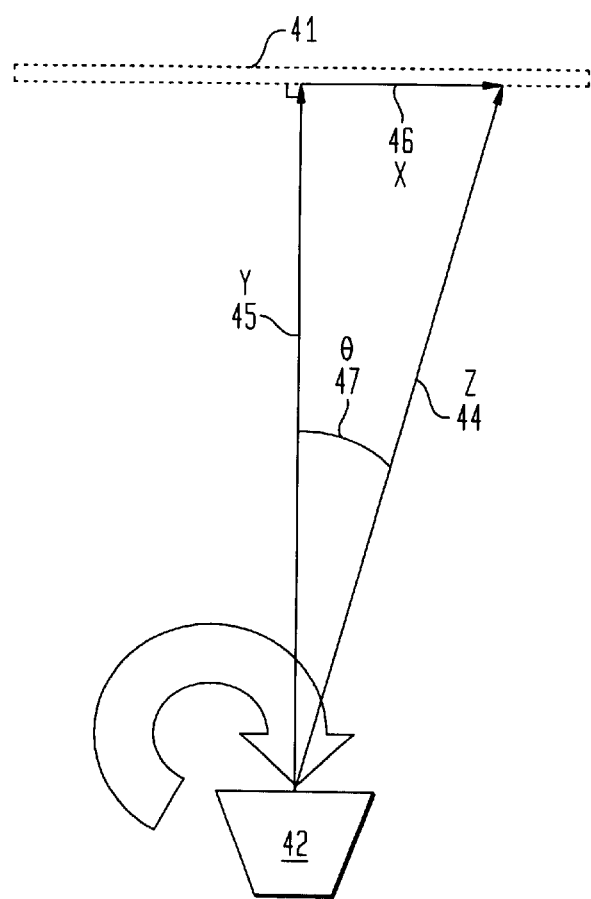
FIG. 4 shows the geometry of a conventional electron beam evaporation source used for deposition of the base metal contact in the self-aligned HBT process according to the present invention.

Importantly, as demonstrated by the resulting base metal 68 coating of emitter metal contact 56 shown in FIG. 7, base metal 68 is deposited at an angle with respect to the surface normal of the semiconductor substrate by virtue of the deposition geometry of the thermal evaporation system, as previously shown in FIG. 4. Therefore, the formation of the "H-shaped" dielectric covering of the emitter metal (i.e., having sidewalls 66) is an important aspect of the present invention. That is, the formation of the "H-shaped" dielectric (having sidewalls 66) insures that there will be some horizontal openings 69 in base metal 68 coating of the dielectric surfaces—due to shadow evaporation. It is preferred that the metal contacts for the base and emitter are made from noble metals such as Au, Pt, and Pd, such that these contacts are not etched by HF.

As further depicted in FIG. 7, the horizontal openings 69 in the base metal 68 not covering dielectric 66 and the vertical undercuts 64 underneath the dielectric sidewalls 66 allow penetration of the HF-based wet chemical etch 67 to completely dissolve the dielectric 66 and further penetrate into metal release layer 57 to remove the portion of base metal 68 from on top of emitter metal contact 56. The inclusion of metal release layer 57 comprised of, for example, Ti or Al, both of which are soluble in HF, is used to accelerate the lateral etch rate for release of base metal 68. Dissolution of this metal release layer 57 releases and allows HF-etching of the insulating layer 58 thereby also releasing and removing that part of base metal 68 on top of emitter metal contact 56. Alternatively, metal release layer 57 is not needed, but etching of insulating layer 58 directly would be much slower (i.e., ~100 times slower).

Figure 8:
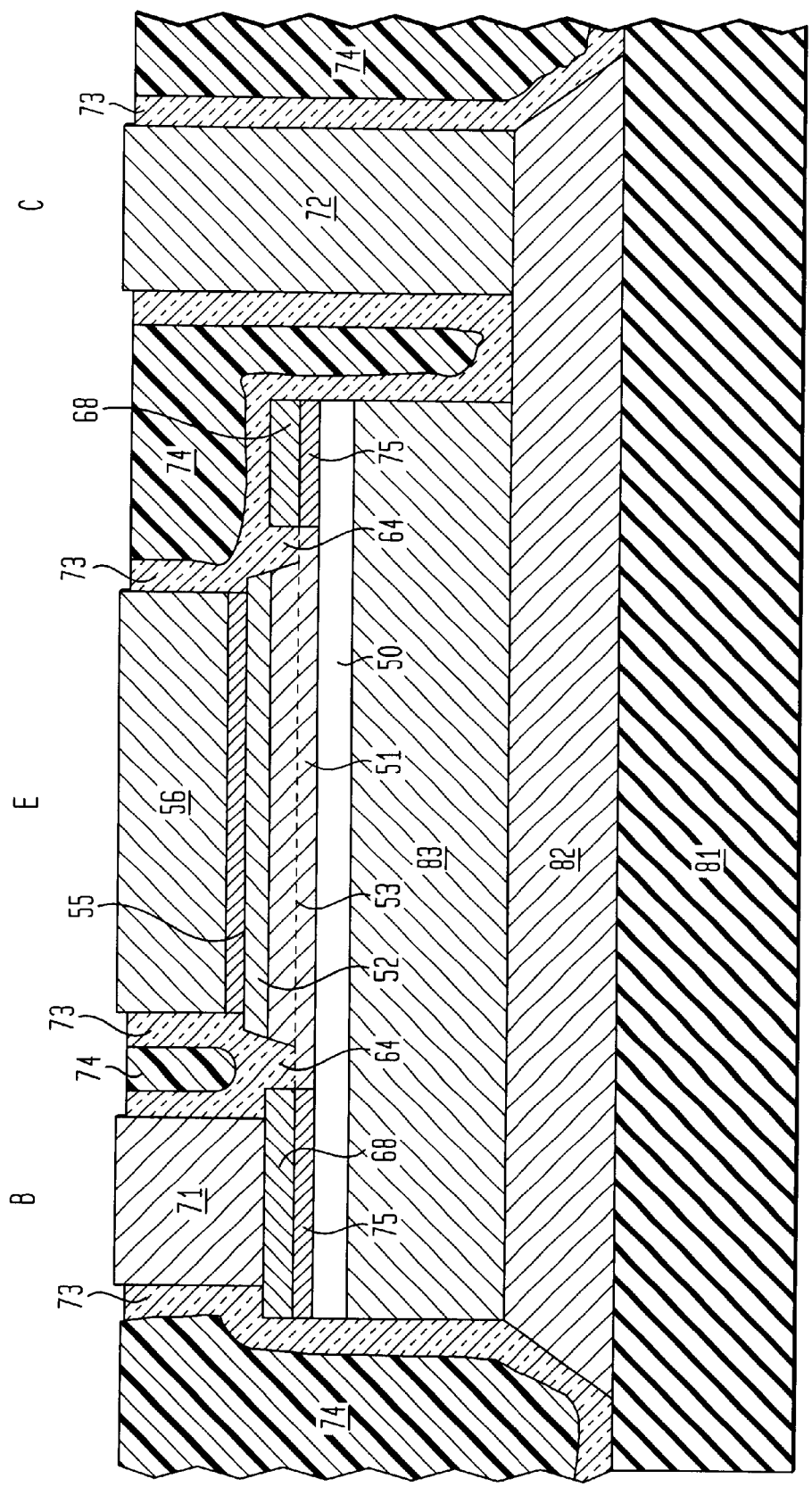
FIG. 8 shows the preferred embodiment of a completed HBT mesa structure showing the emitter, base, and collector contact posts, the dielectric passivation layer, and the polymer planarization layer, in accordance with the present invention.

The formation of the ohmic contact to the base region of the semiconductor substrate is accomplished by sintering the base metal 68 at 400C for 60 seconds. A solid-phase reaction between the base metal 68, comprising, for example, Pt or Pd, and the semiconductor forms an inter-metallic region 75, as shown in FIG. 8. This results in a low resistance contact to the base region of the semiconductor substrate, which is analogous to metal silicides used in Si process technologies. The narrow separation of the base metal 68 from the emitter mesa (which comprises emitter metal layer 52 and emitter layer 51 below emitter metal contact 56) using the self-aligned base metal deposition (typically 0.1–0.3 $\mu$m) along with the narrow emitter width leads to very low base resistance resulting in very high cut-off frequency transistors—a significant improvement over existing HBT fabrication processes. The HBT process proceeds with the definition of the base contact post 71 and collector contact post 72, the passivation of the emitter and collector p-n junctions by PECVD deposition of a dielectric 73, for example, $Si_3N_4$, $SiO_2$, or $SiO_xN_y$, over the entire semiconductor wafer, and the planarization of the wafer in a two-step spin-on and low temperature curing process using a polyimide, or BCB. FIG. 8 shows the preferred embodiment of a completed HBT mesa structure according to the invention depicting the emitter contact post 56, base contact post 71, collector contact post 72, the dielectric passivation layer 73, and the polymer planarization layer 74, which are formed on a semiconductor substrate. Also shown is the semiconductor substrate comprising emitter contact layer 52, emitter layer 51 having etch stop layer 53, base mesa 50, semi-insulating substrate 81, the sub-collector mesa 82, and a low-doped collector layer 83.

The base contact post 71 is preferably formed by vacuum evaporation and lift-off of, for example, Ti, Pt, and Au sequentially using a photoresist mask. The resulting height of the base contact post 71 is chosen such that the top surface of the base contact post 71 is substantially the same as the top of the emitter contact post 56 to facilitate device interconnection. Next, a photoresist mask is used to define the base mesa 50 that is preferably etched using a combination of RIE in a Cl-based etch followed by a wet chemical $H_2O_2$-based etch to remove plasma damage. An alternate approach would be to use a thin P-containing etch stop layer buried within the sub-collector 82 to serve as a selective etch stop in an analogous process used to define the emitter mesa.

Also, similar to defining the base mesa 50, a photoresist mask is used to define the sub-collector mesa 82 for device isolation. The sub-collector 82 is etched down to the semi-insulating substrate 81, as shown in FIG. 8. A sub-collector ohmic contact, i.e., collector contact post 72, is then formed, preferably by vacuum evaporation and lift-off using a photoresist mask. The sub-collector ohmic contact is then sintered, for example, at 400° C. for 60 seconds. Again, as with the base contact post 71, the resulting height of the collector contact post 72 is chosen such that the top surface of the collector contact post 72 is substantially the same as the top of the emitter contact post 56 to facilitate device interconnection.

Next, the emitter and collector p-n junctions are passivated to further protect the p-n junctions and surfaces from harmful environments. This passivation of the emitter and collector p-n junctions is achieved by forming a dielectric layer 73, preferably by PECVD deposition of $Si_3N_4$ or $SiO_2$, over the entire semiconductor wafer. Alternatively, glassivation may be used, in which the passivating layer is a melt of vitreous material that is deposited on the surface of the semiconductor and allowed to harden. Once passivated, the semiconductor wafer is planarized, preferably in a two-step spin-on and low temperature curing process using polyimide or BCB, or other similar compound. The resulting planarization film 74 is then anisotropically plasma etched at low pressures (typically in the range of 10–20 mTorr) to expose the emitter contact post 56, the base contact post 71, and collector contact post 72 for device interconnection. A full cross-sectional schematic view of the preferred embodiment of the complete HBT structure made using the process in accordance with the present invention is depicted in FIG. 8.

Figure 9:
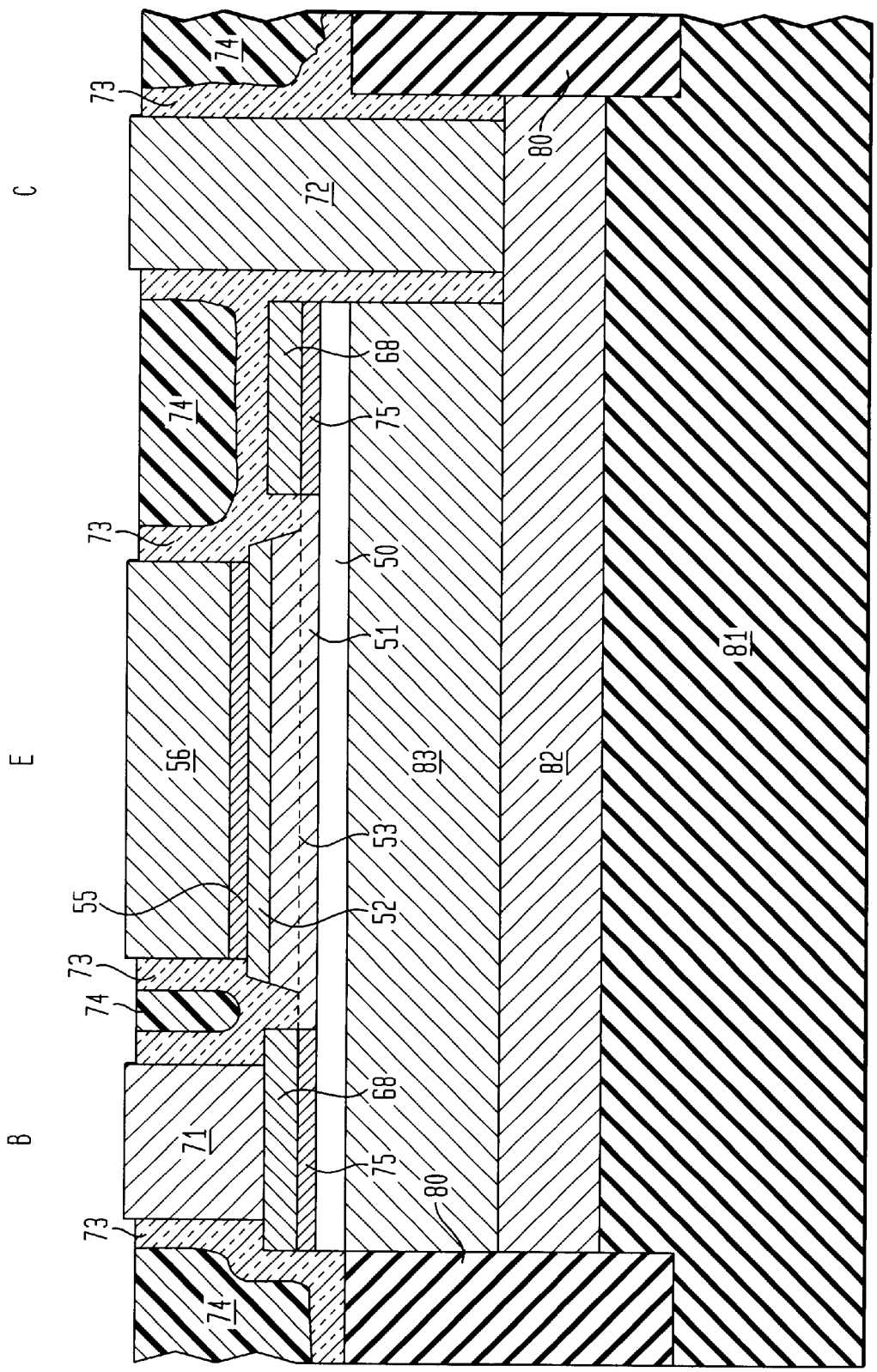
FIG. 9 shows an alternate embodiment of a completed HBT structure using ion implant damage isolation of the extrinsic collector and subcollector regions with a dielectric passivation layer and a polymer planarization layer, in accordance with the present invention.

A full cross-sectional schematic view of an alternate embodiment of a complete HBT structure made using an alternate process for device isolation that may be used in the fabrication of compound semiconductor HBTs (e.g., GaAs HBTs) in accordance with the invention described herein is shown in FIG. 9. This alternate process is substantially similar to the preferred embodiment described herein above, but relies on the use of ion implant damage to cause high resistivity semi-insulating regions 80 to be formed outside of the active areas of the HBTs (i.e., outside the region containing emitter contact post 56, base contact post 71, and collector contact post 72). This is accomplished by implanting non-conducting species, for example helium (He), boron (B), or oxygen (O) at high implant voltages to penetrate the semiconductor wafer down into the semi-insulating substrate 81, which is followed by a low temperature anneal at approximately 400° C. A shallow base mesa 50 must first be formed through the base since the high conductivity of the base cannot be converted to semi-insulating. This process also cannot be used to form semi-insulating regions 80 in low bandgap semiconductors such as InGaAs lattice-matched to InP. In this alternate process of ion implantation, the active area of the device (i.e., the region containing emitter contact post 56, base contact post 71, and collector contact post 72) is masked using a very thick photoresist film or a thick Au layer deposited on top of photoresist, which is removed once the ion implantation regions 80 have been formed.

Figure 10:
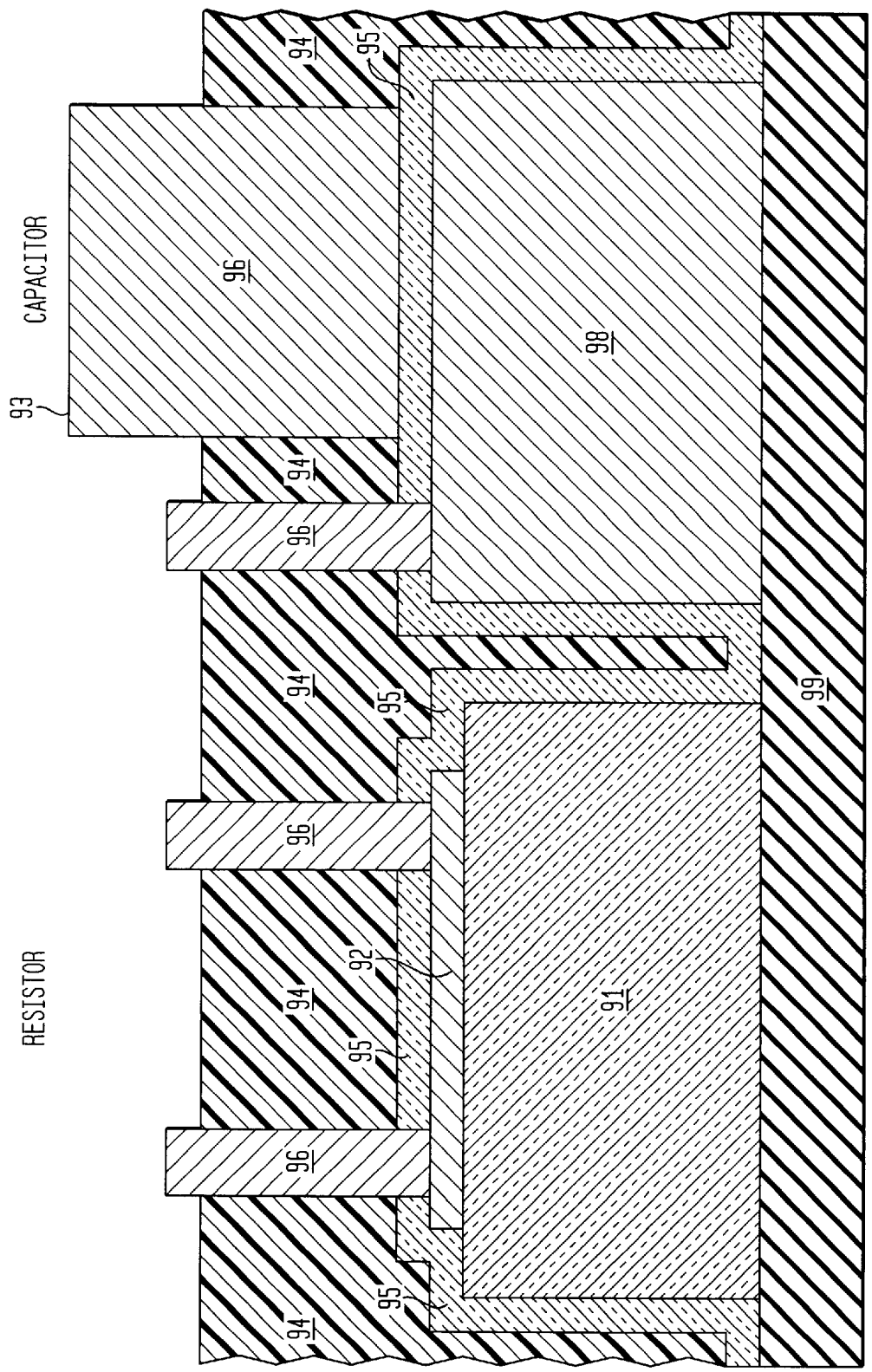
FIG. 10 shows the incorporation of a passive resistor element on top of a $SiO_2$ pedestal formed by vacuum evaporation and lift-off and a capacitor element formed using the collector and base contacts and a dielectric passivation film into the HBT structure manufactured in accordance with the present invention.

Another variation of this HBT process would be to use the passivation film 95 (e.g., $Si_3N_4$ or $SiO_2$) as the interlayer dielectric for metal 93—insulator 95—metal 98 capacitors in an process. A schematic cross-section of this metal 93—insulator 95—metal 98 capacitor element is shown in FIG. 10. The sub-collector metal contact 98 forms the bottom plate of the capacitor, the passivation film 95 forms the insulating dielectric of the capacitor, and the base contact post 96 forms the top plate of the capacitor. In addition, as further shown in FIG. 10, a $SiO_2$ pedestal 91, preferably formed by vacuum evaporation and lift-off, may be used to isolate the thin film resistor 92 from the semi-insulating substrate 99, for the formation of a resistor element. The dielectric film 95 also serves to cover and protect the thin film resistor 92 from the planarization film 94. By altering the metal contact sequence in the HBT process, the base contact posts 96 may be used as contact posts for the thin film resistor 92 and the bottom capacitor plate 98, as well as the top capacitor plate 93.

While the present invention has been described with reference to one or more preferred embodiments, such embodiments are merely exemplary and are not intended to be limiting or represent an exhaustive enumeration of all aspects of the invention. The scope of the invention, therefore, shall be defined solely by the following claims. Further, it will be apparent to those of skill in the art that numerous changes may be made in such details without departing from the spirit and the principles of the invention. It should be appreciated that the present invention is capable of being embodied in other forms without departing from its essential characteristics.

What is claimed is:

1. A process for manufacturing compound semiconductor Heterojunction Bipolar Transistors (HBTs), said process comprising the steps of:

forming an emitter metal contact layer and dielectric covering layers on a compound semiconductor using a tri-level mask;

covering said emitter metal contact layer with a dielectric film, wherein said dielectric film creates sidewalls to provide a dielectric encapsulated emitter metal contact layer which serve as an etch mask for etching of an emitter mesa;

depositing a base metal on top of said dielectric encapsulated emitter metal and an extrinsic base region of said semiconductor;

removing excess amounts of said base metal from said dielectric encapsulated emitter metal;

sintering said base metal on said extrinsic base region of said semiconductor through an emitter etch stop layer within an emitter layer of said semiconductor;

forming a base contact on at least one of said sintered base metal regions;

forming a base mesa;

forming a collector contact on said semiconductor;

forming a collector mesa;

depositing a dielectric film to encapsulate and passivate the emitter and collector p-n junctions;

planarizing said HBT with a planarization film; and etching said planarization film to expose said emitter, base, and collector contacts of said HBT and the contact posts for passive elements to facilitate device interconnection.

2. A process according to claim 1, wherein said tri-level mask is a photoresist-dielectric-photoresist mask.

3. A process according to claim 2, wherein said dielectric in said tri-level mask is $SiO_2$.

4. A process according to claim 2, wherein said dielectric in said tri-level mask is glass.

5. A process according to claim 1, wherein said emitter contact layers and said dielectric covering layer are defined by thermal evaporation and lift-off.

6. A process according to claim 1, wherein said dielectric sidewalls are $Si_3N_4$.

7. A process according to claim 1, wherein said dielectric sidewalls are $SiO_2$.

8. A process according to claim 1, wherein said dielectric film that encapsulates said emitter metal is formed in an "H-shaped" pattern.

9. A process according to claim 1, wherein said dielectric film that encapsulates said emitter metal is formed in an "inverted U-shaped" pattern.

10. A process according to claim 1, wherein said emitter mesa is defined using a combination of dry etching with chlorine-based reactive ion etching (RIE), followed by wet etching in $H_2O_2$ based etchant to stop at a buried P-containing layer within said emitter metal and undercut said dielectric sidewalls.

11. A process according to claim 1, wherein said removing of excess base metal over said dielectric encapsulated emitter metal is done in a HF-based wet etch.

12. A process according to claim 1, wherein said base and subcollector mesas are formed by a combination of dry etching by chlorine-based RIE followed by wet chemical etching in $H_2O_2$ based etchant with a possible buried P-containing etch stop layer in the subcollector region.

13. A process according to claim 1, wherein base and subcollector contact posts and passive element contact posts are defined with a height approximately equal to the height of the emitter metal.

14. A process according to claim 1, wherein said passivation dielectric films are deposited by PECVD.

15. A process according to claim 1, wherein said passivation dielectric films are $Si_3N_4$.

16. A process according to claim 1, wherein said passivation dielectric films are $SiO_2$.

17. A process according to claim 1, wherein said passivation dielectric films are $SiO_xN_y$.

18. A process according to claim 1, wherein said passivation dielectric films are deposited by a spin-on process.

19. A process according to claim 1, wherein said planarizing is accomplished by a two-step process using spin-on and thermally cured polymer films.

20. A process according to claim 19, wherein said polymer film is polyimide.

21. A process according to claim 19, wherein said polymer film is BCB.

22. A process according to claim 1, wherein said anisotropic dry etching is by reactive ion etching (RIE) using an oxygen and fluorine plasma.

23. A process according to claim 1, wherein said passive elements include resistors, capacitors, and inductors.

24. A process according to claim 1, wherein the separation between the emitter and base metal contacts is less than 1 $\mu$m.

25. A process according to claim 1, wherein the separation between the emitter and base metal contacts is 0.1 $\mu$m.

26. A process according to claim 1, wherein the width of the emitter metal is equal to or less than 1 $\mu$m down to the resolution limits of UV photolithography.

27. A process according to claim 1, wherein the size of said emitter mesa is less than the width of said emitter metal contact.

28. A process according to claim 1, wherein the size of said emitter mesa is equal to the width of said emitter metal contact.

29. A process according to claim 1, wherein the size of said emitter mesa is greater than the width of said emitter metal contact.

30. A process according to claim 1, wherein the width of said emitter mesa depends upon the extent of said undercut of said dielectric sidewalls covering said emitter metal, wherein said undercut is produced by a wet etch, a dry etch or a combination wet and dry etch.

31. A process according to claim 1, wherein the emitter and base contact metals are selected from the group consisting of gold, platinum, and palladium.

32. A process according to claim 1, wherein a thin metal layer is inserted under the dielectric covering the emitter metal to facilitate base metal lift-off.

33. A process according to claim 32, wherein said thin metal layer is titanium.

34. A process according to claim 32, wherein said thin metal layer is aluminum.

35. A process according to claim 32, wherein said thin metal layer is a metal which is soluble in HF.

36. A process according to claim 1, wherein a thin metal is deposited on top of said dielectric covering said emitter metal so as to produce a "H-shaped" dielectric encapsulant for said emitter metal.

37. A process according to claim 36, wherein said thin metal is titanium.

38. A process according to claim 36, wherein said thin metal is aluminum.

39. A process according to claim 36, wherein said thin metal is a metal which is soluble in HCl.

40. A process according to claim 1, wherein said etch stop layer is said emitter metal contact layer.

41. A process according to claim 1, wherein said etch stop layer is a P-containing etch stop.

42. A process according to claim 1, wherein the thickness of said etch stop layers in in the range of 10–50 nm.

43. A process according to claim 1, wherein said etch stop layers are less than 10 nm in thickness.

44. A process according to claim 1, wherein the remaining emitter layer in said extrinsic base region remains fully depleted.

45. A process according to claim 1, wherein the location of said etch stop layer is chosen such that the remaining emitter layers over the extrinsic base region remain substantially depleted of carriers under all bias conditions of the HBT such that there is no lateral current flow between said metal layer and said emitter layer.

46. A process according to claim 1, wherein said etch stop layers are chosen such that they are not etched in $H_2O_2$ containing wet etches.

47. A process according to claim 1, wherein said base layer is doped with carbon.

48. A process according to claim 1, wherein said base layer is doped with beryllium.

49. A process according to claim 1, wherein said base layer is doped with zinc.

50. A process according to claim 1, wherein the same dielectric passivation layer for the emitter and collector p-n junctions is used for the interlayer dielectric for metal-insulator-metal (MIM) capacitors in an IC process.

51. A process according to claim 50, wherein the dielectric passivation layer is used to protect thin film resistors.

52. A process according to claim 51, wherein thin film resistors are deposited on a dielectric pedestal formed by evaporation and lift-off to prevent interaction with the thin film resistor and semi-insulating substrate.

53. A process according to claim 1, wherein interdevice isolation is accomplished after etching a shallow base mesa.

54. A process according to claim 53, wherein said shallow base mesa electrical isolation is formed by high energy ion implant damage followed by thermal annealing to produce a quasi-planar process.

55. A process according to claim 54, wherein the ion implant species used to form damage isolation regions are selected from the group consisting of hydrogen, helium, boron, oxygen, nitrogen, fluorine and neon.

56. A process according to claim 1, wherein multiple emitter fingers are interconnected to form high power HBT devices.

57. A process according to claim 56, wherein said interconnecting is done using thick gold metalization to provide a thermal shunt to equalize emitter temperatures and emitter current densities.

58. A process according to claim 57, wherein said thick gold metal thermal shunt is flip chip bonded to a heat sink to improve the power handling of multiple emitter finger HBTs.

59. A process according to claim 1, wherein said sintering of base metal through remaining emitter layers is used to form a low resistance contact to said extrinsic base region.

60. A process according to claim 1, wherein said sintering of base metal through remaining emitter layers passivates a surface of the extrinsic base region.

61. A process according to claim 1, wherein said emitter and base epitaxial layers are grown using a method selected from the group consisting of Molecular Bean Epitaxy (MBE) and Metal Organic Chemical Vapor Deposition (MOCVD).

* * * * *